(12) United States Patent
Ozawa

(10) Patent No.: US 11,347,214 B2
(45) Date of Patent: May 31, 2022

(54) INSPECTION DEVICE, MAINTENANCE METHOD, AND PROGRAM

(71) Applicant: Tokyo Electron Limited, Tokyo (JP)

(72) Inventor: Tomokazu Ozawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 178 days.

(21) Appl. No.: 16/692,282

(22) Filed: Nov. 22, 2019

(65) Prior Publication Data

US 2020/0166919 A1 May 28, 2020

(30) Foreign Application Priority Data

Nov. 28, 2018 (JP) .............................. JP2018-222546

(51) Int. Cl.
*G05B 23/02* (2006.01)
*H01L 21/66* (2006.01)
*G05B 19/042* (2006.01)

(52) U.S. Cl.
CPC ..... *G05B 23/0272* (2013.01); *G05B 19/0428* (2013.01); *G05B 23/0216* (2013.01); *H01L 22/12* (2013.01)

(58) Field of Classification Search
CPC ............ G05B 23/0216; G05B 19/0428; G05B 23/0272
USPC ........................................................ 700/83
See application file for complete search history.

(56) References Cited

U.S. PATENT DOCUMENTS

| 8,972,036 | B2 * | 3/2015 | Nomura | G05B 15/02 700/112 |
|---|---|---|---|---|
| 10,984,520 | B2 * | 4/2021 | Ueda | G06Q 50/04 |
| 2010/0023602 | A1 * | 1/2010 | Martone | G06F 8/60 709/220 |
| 2013/0046403 | A1 * | 2/2013 | Nakagawa | H01L 21/67005 700/121 |
| 2013/0170734 | A1 * | 7/2013 | Uchiyama | G06K 9/46 382/149 |

FOREIGN PATENT DOCUMENTS

| JP | 5538955 | * | 7/2014 |
|---|---|---|---|
| JP | 2017-112387 A | | 6/2017 |
| TW | 539964 | * | 7/2003 |
| TW | 201207415 | * | 2/2012 |
| TW | 201738812 | * | 11/2017 |

* cited by examiner

*Primary Examiner* — Hien D Khuu
(74) *Attorney, Agent, or Firm* — Fenwick & West LLP

(57) ABSTRACT

An inspection device having a plurality of inspection chambers and configured to inspect target objects in the inspection chambers comprises a display unit, a maintenance control unit, a display control unit, a connection unit and an exclusive control unit. The display unit displays a screen for operating the inspection device. The maintenance control unit performs a maintenance process on a mechanism related to the inspection chambers. The display control unit displays a maintenance screen for receiving an operation for performing the maintenance process on the display unit. The connection unit connects the inspection device and an external device. The exclusive control unit performs exclusive control for preventing competition in the inspection process or the maintenance process for the same mechanism.

6 Claims, 15 Drawing Sheets

INSPECTION DEVICE, MAINTENANCE METHOD, AND PROGRAM

CROSS-REFERENCE TO RELATED APPLICATION

This application claims priority to Japanese Patent Application No. 2018-222546, filed on Nov. 28, 2018, the entire contents of which are incorporated herein by reference.

TECHNICAL FIELD

The present disclosure relates to an inspection device, a maintenance method, and a program.

BACKGROUND

In a semiconductor device manufacturing process, an inspection device for performing inspection such as electric characteristic test or the like on a manufactured semiconductor device (wafer) is used. As such an inspection device, there is an inspection device capable of inspecting a plurality of wafers simultaneously.

Japanese Patent Application Publication No. 2017-112387 discloses an inspection device having a plurality of inspection chambers. In this inspection device, an inspection area in which a test head is disposed is formed between a transfer area where a transfer unit for transferring a wafer is disposed and a maintenance area where maintenance of the test head is performed in order to facilitate the replacement of a test head provided with a main board that is an inspection circuit. Further, in the inspection area, the inspection chambers accommodating test heads are arranged close to each other. The test heads can be transferred from the inspection chambers to the maintenance area.

SUMMARY

The present disclosure provides a technique capable of improving the maintenance performance of an inspection device having a plurality of inspection chambers.

In accordance with an aspect of the present disclosure, there is provided an inspection device having a plurality of inspection chambers and configured to inspect target objects in the inspection chambers, comprising: a display unit configured to display a screen for operating the inspection device; a maintenance control unit configured to perform a maintenance process on a mechanism related to the inspection chambers; a display control unit configured to display a maintenance screen for receiving an operation for performing the maintenance process on the display unit; a connection unit configured to connect the inspection device and an external device; and an exclusive control unit configured to perform exclusive control for preventing competition in the inspection process or the maintenance process for the same mechanism, wherein the display control unit displays the maintenance screen on the external device connected to the connection unit, the maintenance control unit performs the maintenance process in response to an operation on the maintenance screen displayed on the external device, and the exclusive control unit enables only one operation between an operation on the maintenance screen displayed on the external device or an operation on the screen displayed on the display unit in the case of performing the maintenance process on one mechanism.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
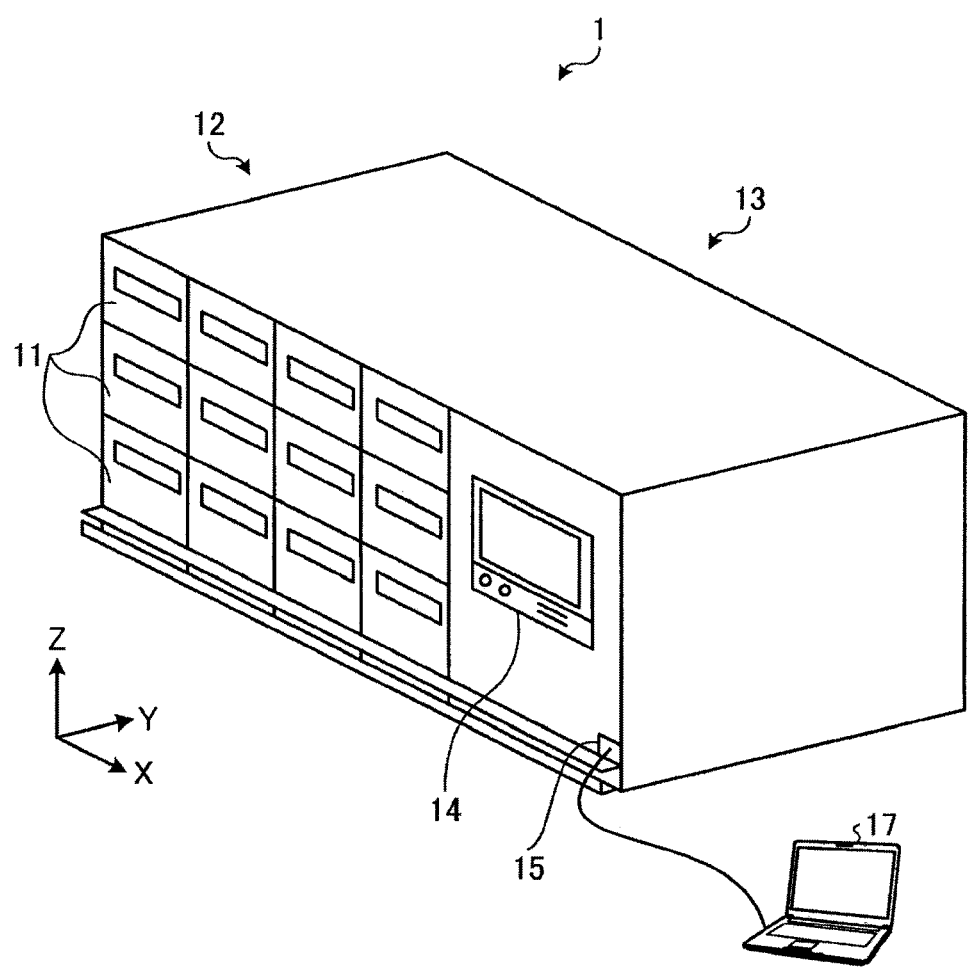
FIG. 1 is a perspective view showing an example of an external configuration of an inspection device according to an embodiment.

Hereinafter, embodiments will be described in detail with reference to the accompanying drawings. Like reference numerals will be given to like or corresponding parts throughout the drawings.

FIG. 1 is a perspective view showing an example of an external configuration of an inspection device 1 according to an embodiment. The inspection device 1 includes a cell tower 12, a loader 13, a main monitor 14 (display unit), and a connector 15 (connection unit). In FIG. 1, the X-axis represents a width direction; the Y-axis represents a depth direction; and the Z-axis represents a height direction.

The cell tower 12 has a plurality of inspection chambers (cells) 11 laminated in multi-stages. The cell tower 12 of the present embodiment has 12 (3 stages×4 rows) inspection chambers 11.

The loader 13 is disposed near the cell tower 12 and has therein a unit for transferring a wafer as an inspection target.

The main monitor 14 is included in the inspection device 1 and serves as a user interface for operating the inspection device 1. The main monitor 14 is connected to a computer in the inspection device 1 and displays various operation screens for executing various functions of the inspection device 1. The main monitor 14 has a display for displaying an image, and an operation unit (a keyboard, a touch panel, or the like) for receiving a user's input operation. The operation screen of the main monitor 14 of the present embodiment includes a local screen for receiving operations related to general processes such as an inspection process and the like, and a maintenance screen for receiving operations related to a maintenance process.

The connector 15 is an interface that connects the inspection device 1 and an external device 17 to establish communication therebetween. Here, a state in which one external device 17 (e.g., general-purpose personal computer (PC)) is connected to the connector 15 through a cable is illustrated. However, the connection method or the number of connected devices is not limited thereto.

Figure 2:
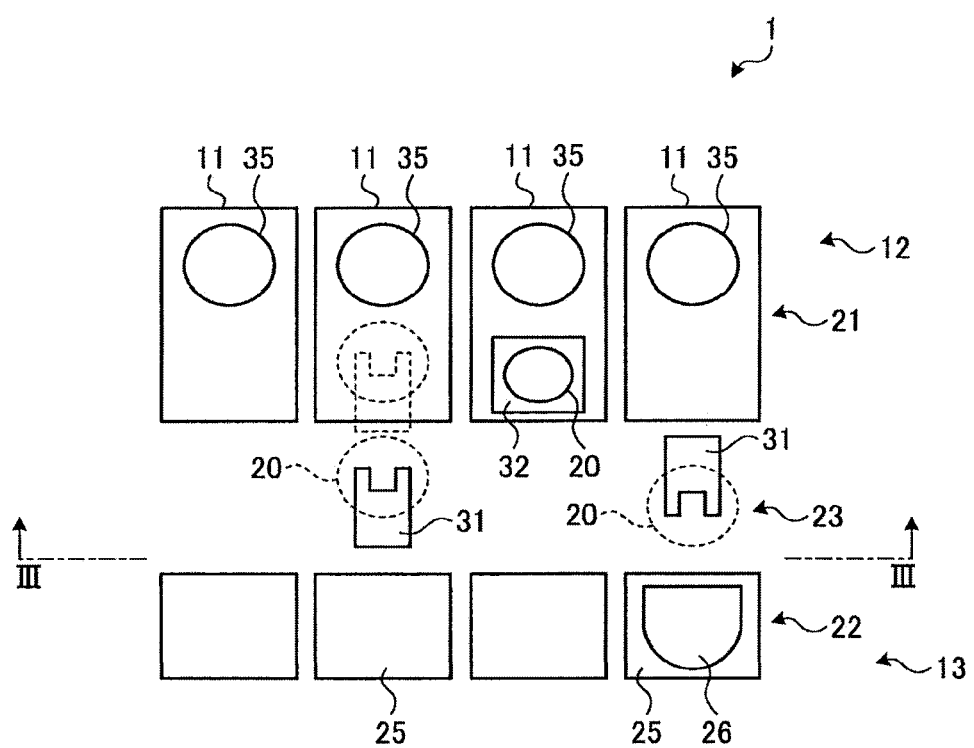
FIG. 2 shows an example of an internal configuration of the inspection device according to the embodiment.

FIG. 2 shows an example of an internal configuration of the inspection device 1 according to the embodiment. The inspection device 1 includes an inspection area 21, a loading/unloading area 22, and a transfer area 23.

The inspection area 21 for performing inspection such as an electrical characteristic test or the like on a wafer 20 includes the spaces in the inspection chambers 11. The loading/unloading area 22 for loading/unloading the wafer 20, a probe card, or the like includes the space in the loader 13. The transfer area 23 is disposed between the loading/unloading area 22 and the inspection area 21.

The loading/unloading area 22 is partitioned by a plurality of unit loading/unloading areas 25. An accommodating mechanism of a FOUP 26 is disposed in each of the unit loading/unloading areas 25. A loading/unloading mechanism 31 is disposed in the transfer area 23. The loading/unloading mechanism 31 transfers an uninspected wafer 20 from the FOUP 26 in the loading/unloading area 22 along the transfer area 23 to a transfer mechanism 32 in the inspection area 21 which will be described later. Further, the loading/unloading mechanism 31 transfers an inspected wafer 20 from the inspection area 21 to the transfer area 23.

Figure 3:
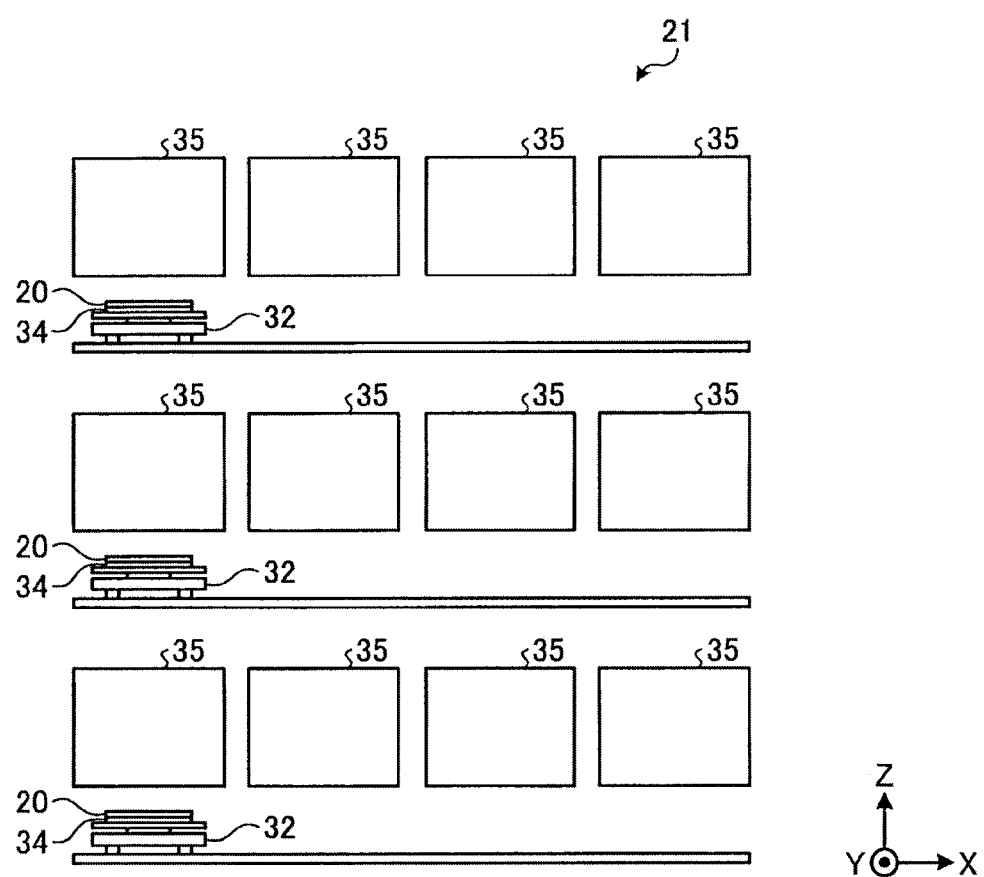
FIG. 3 is a cross-sectional view taken along a line in FIG. 2 and shows an example of a configuration of an inspection region according to the embodiment.

FIG. 3 is a cross-sectional view taken along a line in FIG. 2, and shows an example of a configuration of the inspection area 21 according to the embodiment. A plurality of testers 35 is disposed in the inspection area 21. In the configuration shown in FIG. 3, testers 35 adjacent to each other are not partitioned, and the testers 35 are arranged in continuous spaces.

The transfer mechanism 32 receives the uninspected wafer 20 transferred to the boundary between the inspection area 21 and the transfer area 23 by the loading/unloading mechanism 31 on a wafer plate 34 of the transfer mechanism 32, and delivers the uninspected wafer 20 to be in contact with the probe card attached to the tester 35. Further, the transfer mechanism 32 transfers the inspected wafer 20 to the boundary between the inspection area 21 and the transfer area 23, and delivers the processed wafer 20 to the loading/unloading mechanism 31.

Figure 4:
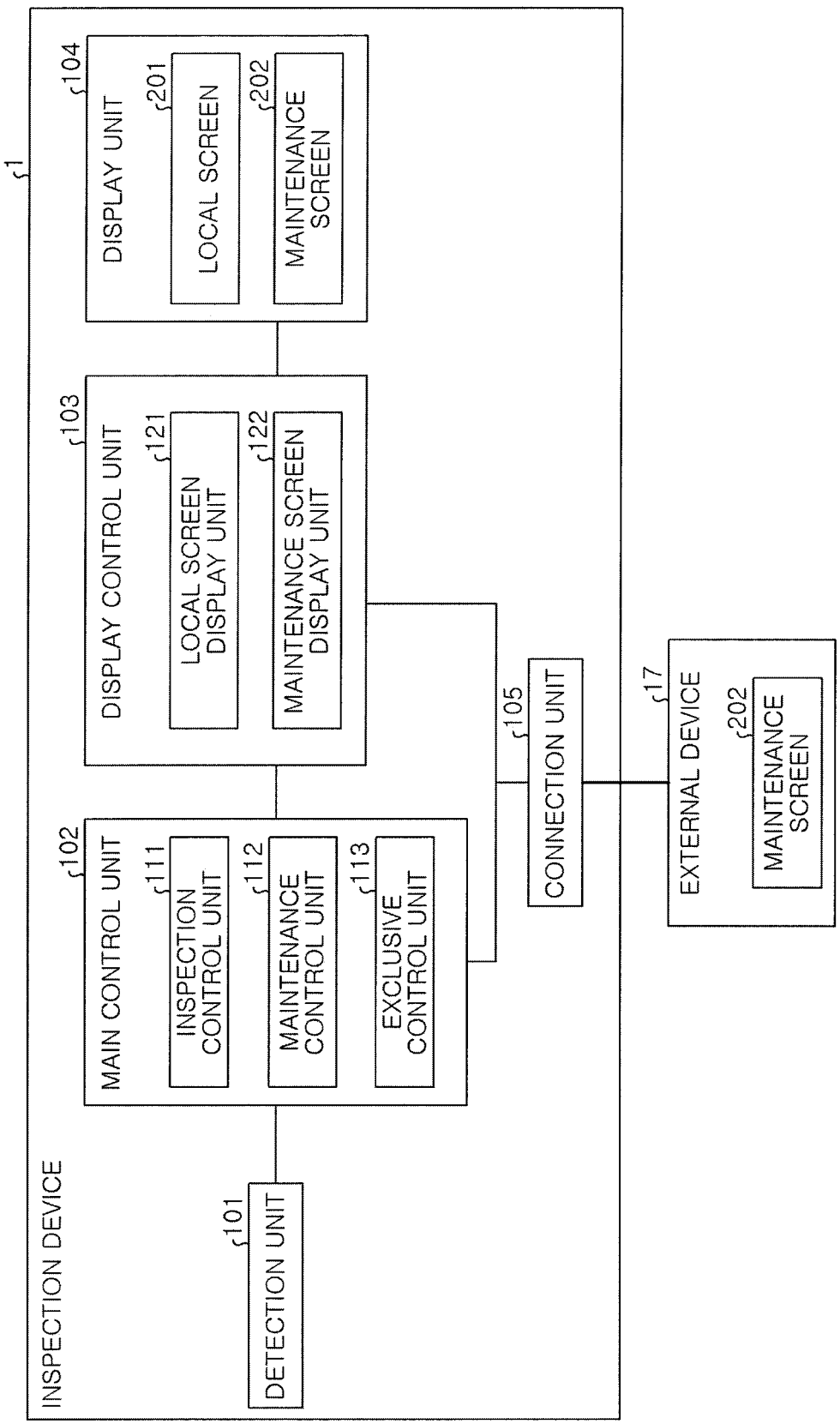
FIG. 4 is a block diagram showing an example of a functional configuration of the inspection device according to the embodiment.

FIG. 4 is a block diagram showing an example of a functional configuration of the inspection device 1 according to the embodiment. The inspection device 1 includes a detection unit 101 (detection device), a main control unit 102, a display control unit 103 (display control device), a display unit 104 (display device), and a connection unit 105 (connection device).

The detection unit 101 detects abnormality occurring in a mechanism related to the inspection chambers 11. The detection unit 101 detects abnormality based on information indicating a state of each mechanism as a detection target (detection signals obtained by various sensors installed in each mechanism and the like). The mechanism as the detection target may be, e.g., the tester 35, the loader 13, the loading/unloading mechanism 31, the transfer mechanism 32, or the like. The "abnormality" is not limited to a failure state, and may occur, e.g., when regular maintenance is performed, or when a lifespan set for each component is over, or the like. The detection unit 101 may include various sensors, a CPU, a control program, and the like.

The main control unit 102, which is an electronic control unit for controlling the inspection device 1, includes an inspection control unit 111, a maintenance control unit 112 (maintenance control device), and an exclusive control unit 113 (exclusive control device). The main control unit 102 may include a CPU, a control program, and the like.

The inspection control unit 111 performs an inspection process for inspecting the wafer 20 using the tester 35.

The maintenance control unit 112 performs a maintenance process on mechanisms related to the inspection chambers 11. The maintenance process may be performed on a mechanism or the like having abnormality detected by the detection unit 101, or may be performed on a mechanism having no detected abnormality in response to a user's request or the like. Specific contents of the maintenance process are not particularly limited, and may be appropriately determined depending on types of mechanisms of the inspection device 1. For example, the maintenance process may be a repair work, a replacement work or the like for the tester 35, the loader 13, the loading/unloading mechanism 31, and the transfer mechanism 32.

The exclusive control unit 113 performs exclusive control for preventing competition in the inspection process or the maintenance process for the same mechanism. The exclusive control unit 113 of the present embodiment performs first exclusive control for preventing the inspection process and the maintenance process from being simultaneously performed on one mechanism. In the case of performing the maintenance process on one mechanism, the exclusive control unit 113 performs second exclusive control for enabling only one operation between an operation on a maintenance screen 202 displayed on the external device 17 and an operation on the operation screen displayed on the main monitor 14 (the maintenance screen 202 or a local screen 201). The exclusive control will be described in detail later.

The display control unit 103 displays the operation screen for executing the function of the inspection device 1. The display control unit 103 includes a local screen display unit 121 and a maintenance screen display unit 122. The display control unit 103 may include a CPU, a control program, and the like.

The local screen display unit 121 displays the local screen 201 that is an operation screen for executing general processes such as an inspection process and the like on the display unit 104 (the main monitor 14). The inspection control unit 111 of the main control unit 102 controls the inspection process in response to an operation on the local screen 201 displayed on the display unit 104.

The maintenance screen display unit 122 displays the maintenance screen 202 that is an operation screen for executing the maintenance process on the display unit 104 (the main monitor 14) or the external device 17. In other words, the maintenance screen display unit 122 displays the maintenance screen 202 not only on the main monitor 14 but also on the display of the external device 17 connected to the connection unit 105. The maintenance control unit 112 of the main control unit 102 controls the maintenance process in response to an operation on the maintenance screen 202 displayed on the display unit 104 (the main monitor 14 of the inspection device 1) or on the maintenance screen 202 displayed on the external device 17.

The display unit 104 displays the local screen 201 and the maintenance screen 202 based on the control of the display control unit 103. The display unit 104 may include the main monitor 14, a CPU, a control program, an image processing circuit (FPGA: Field Programmable Gate Array or ASIC: Application Specific Integrated Circuit), or the like.

The connection unit 105 connects the inspection device 1 and the external device 17. The connection unit 105 may include, e.g., Ethernet (Registered Trademark), USB (Universal Serial Bus), wireless LAN, or the like.

As described above, the inspection device 1 of the present embodiment has a function of displaying the maintenance screen 202 on the external device 17 connected to the connection unit 105 and performing the maintenance process of the inspection device 1 through the maintenance screen 202 displayed on the external device 17. Accordingly, it is possible to perform the maintenance process on the mechanism having detected abnormality through the maintenance screen 202 displayed on the external device 17 while performing the inspection process or the like on, e.g., a mechanism (the inspection chamber 11) having no detected abnormality, through the local screen 201 displayed on the main monitor 14.

In the case of performing the maintenance operation on one mechanism, the inspection device 1 of the present embodiment performs second exclusive control for enabling only one operation between the operation on the maintenance screen 202 displayed on the external device 17 or the operation on the operation screen (the maintenance screen 202 or the local screens 201) displayed on the main screen 14, i.e., the second exclusive control for preventing the maintenance process from being simultaneously performed on one mechanism through multiple maintenance screens 202. Therefore, when the maintenance process is being performed on a certain tester 31 through the maintenance screen 202 displayed on the external device 17, it is not possible to perform the maintenance process on the tester 31 through the local screen 201 or the maintenance screen 202 displayed on the main monitor 14. Accordingly, it is possible to prevent multiple instructions from competing for one mechanism as a maintenance target.

Figure 5:
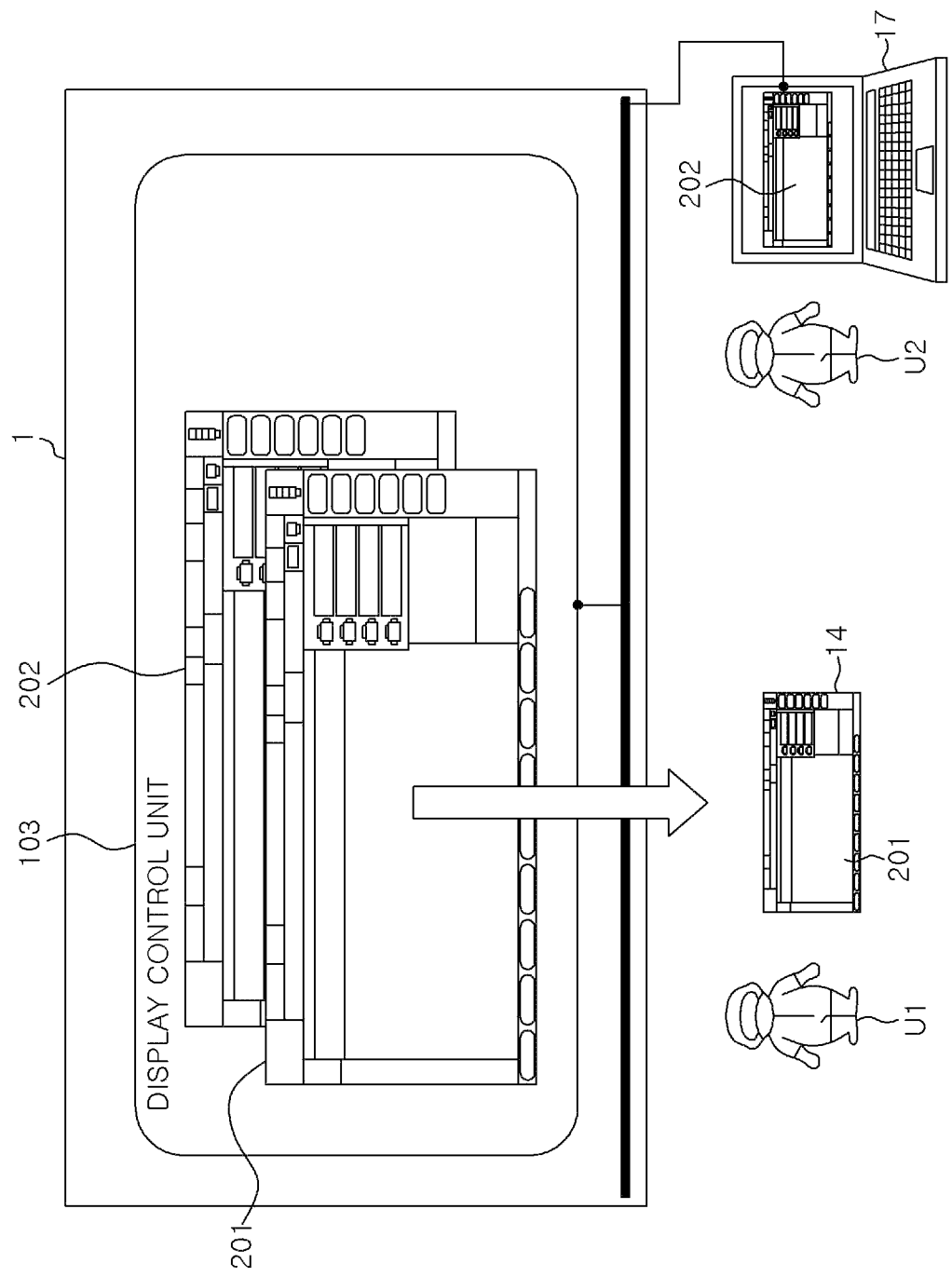
FIG. 5 conceptually shows an example of a state in the case of performing an inspection process and a maintenance process in the inspection device according to the embodiment.

FIG. 5 conceptually shows an example of a state in the case of performing the inspection process and the maintenance process in the inspection device 1 according to the embodiment. The display control unit 103 of the inspection device 1 generates image data for displaying the local screen 201 and image data for displaying the maintenance screen 202. When a certain user U1 performs an inspection process through the local screen 201 displayed on the main monitor 14, the maintenance screen 202 is hidden by the local screen 201. In this state, if the user U1 attempts to perform the maintenance process on a certain mechanism, the local screen 201 is hidden by the maintenance screen 202 of the main monitor 14, which makes it possible to proceed the inspection process. Since the switching between the local screen 201 and the maintenance screen 202 is required, it is difficult to perform the inspection process and the maintenance process at the same time.

In this case, if the external device 17 is connected to the inspection device 1, the maintenance screen 202 is displayed on the display of the external device 17. Then, when another user U2 manipulates the maintenance screen 202 displayed on the external device 17, the maintenance process can be performed on the inspection device 1. Accordingly, a state where the user U1 performs the inspection process through the local screen 201 displayed on the main monitor 14, the user U2 can perform the maintenance process through the maintenance screen 202 displayed on the external device 17. In this example, the main monitor 14 and the external device 17 are manipulated by two users U1 and U2. However, one user may manipulate both of the main monitor 14 and the external device 17.

Figure 6:
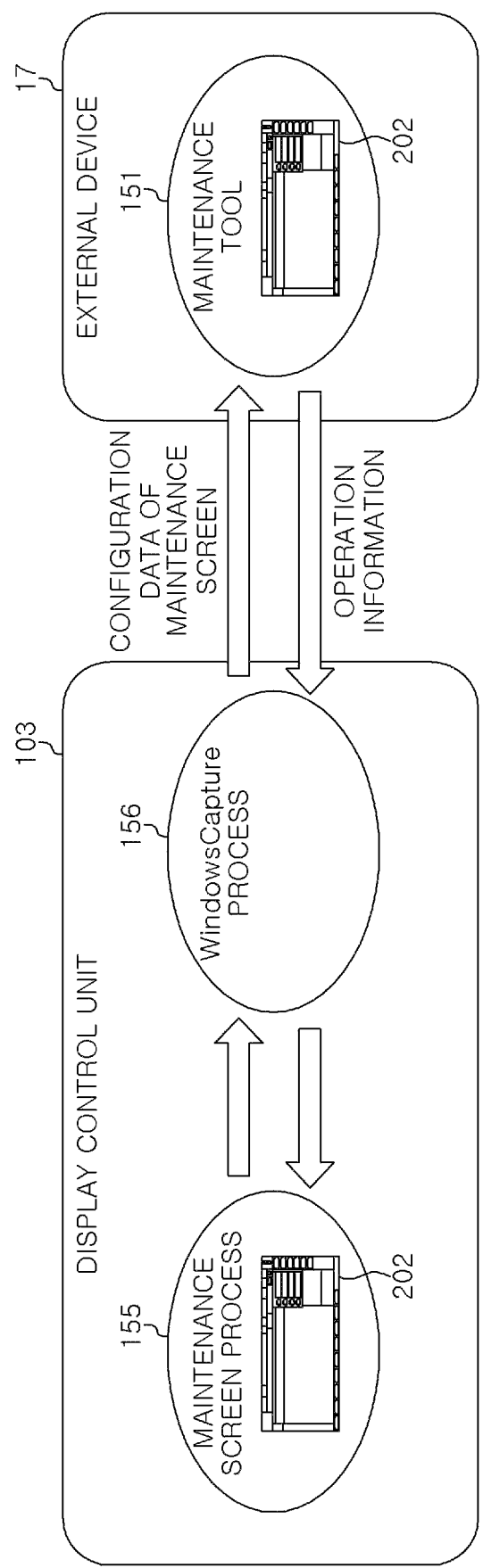
FIG. 6 conceptually shows an example of a function of a display control unit according to the embodiment.

FIG. 6 conceptually shows an example of the function of the display control unit 103 according to the embodiment. The external device 17 includes a maintenance tool 151 for performing the maintenance process of the inspection device 1 through the maintenance screen 202. The display control unit 103 of the inspection device 1 has a maintenance screen process 155 for generating the maintenance screen 202, and a Windows (Registered Trademark) capture process 156 for sharing information with the maintenance tool 151.

The Windows capture process 156 acquires screen configuration data (e.g., image data such as JPG, GIF, PNG, BMP, or the like) indicating a screen configuration of the maintenance screen 202 from the maintenance screen process 155, and transmits the screen configuration data to the maintenance tool 151. At this time, the maintenance tool 151 receives not the actual state of the process performed on the maintenance screen 202 but the screen configuration data of the maintenance screen 202, and displays the maintenance screen 202 based on the screen configuration data on the display of the external device 17. Then, the maintenance tool 151 transmits information (such as coordinate information of a pressed screen) on an operation on the maintenance screen 202 displayed on the display to the Windows capture process 156. The Windows capture process 156 issues an event corresponding to the operation information acquired from the maintenance tool 151, acquires the screen configuration data of the maintenance screen 202 that reflects the event from the maintenance screen process 155, and transmits the screen configuration data to the maintenance tool 151. The maintenance tool 151 shifts the maintenance screen 202 displayed on the display of the external device 17 based on the screen configuration data received from the Windows capture process 156. Accordingly, even if the external device 17 does not have a substantial function of performing the maintenance process, the maintenance process of the inspection device 1 can be performed through the display of the external device 17. Since the external device 17 does not have a substantial function (software) of performing the maintenance process, when the software of the inspection device 1 is changed, it is not necessary to update the software on the external device 17 side associated therewith.

Figure 7:
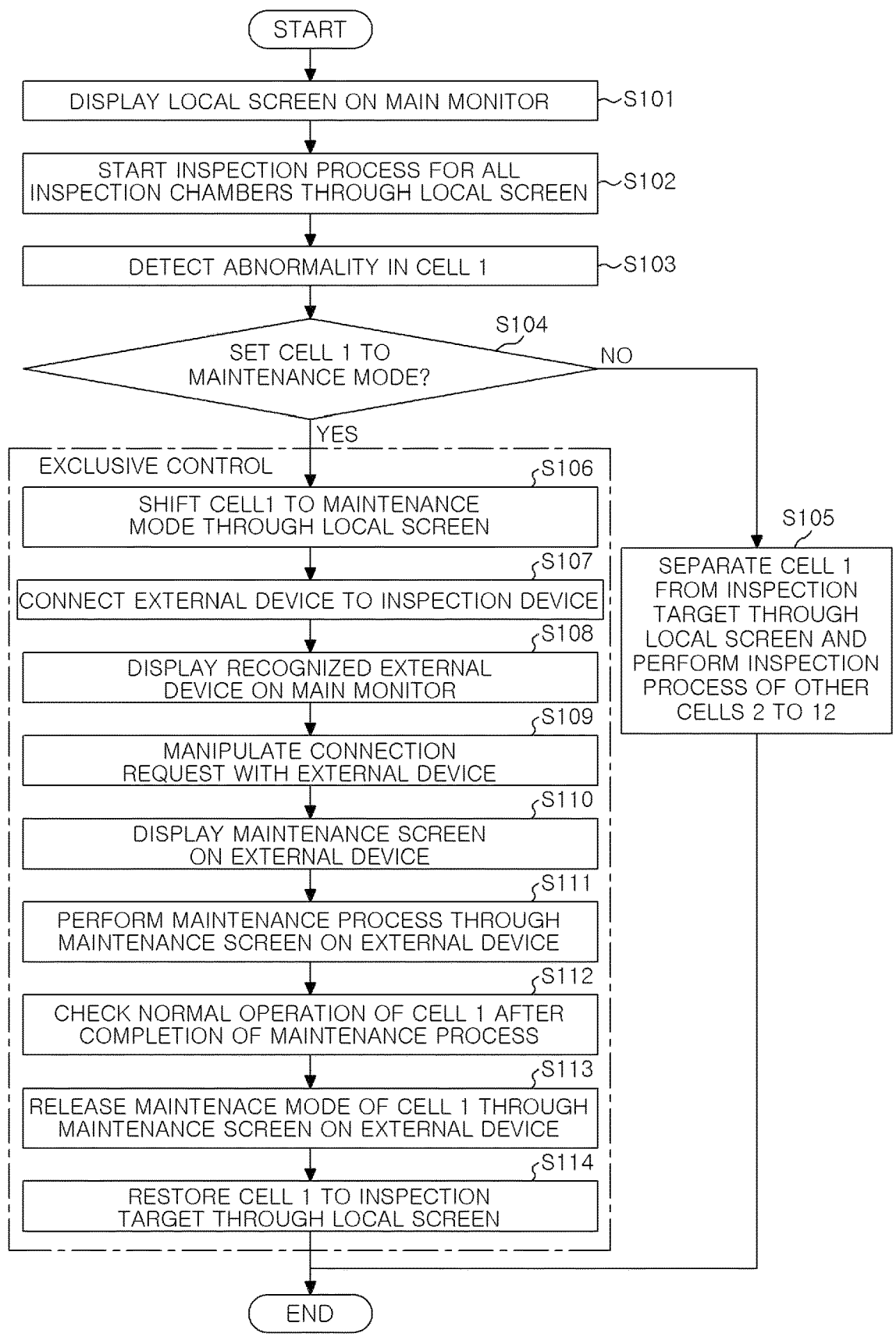
FIG. 7 is a flowchart showing an example of processing in the inspection device according to the embodiment.

FIG. 7 is a flowchart showing an example of processing in the inspection device 1 according to the embodiment. First, the local screen display unit 121 displays the local screen 201 on the main monitor 14 of the inspection device 1 (step S101).

Figure 8:
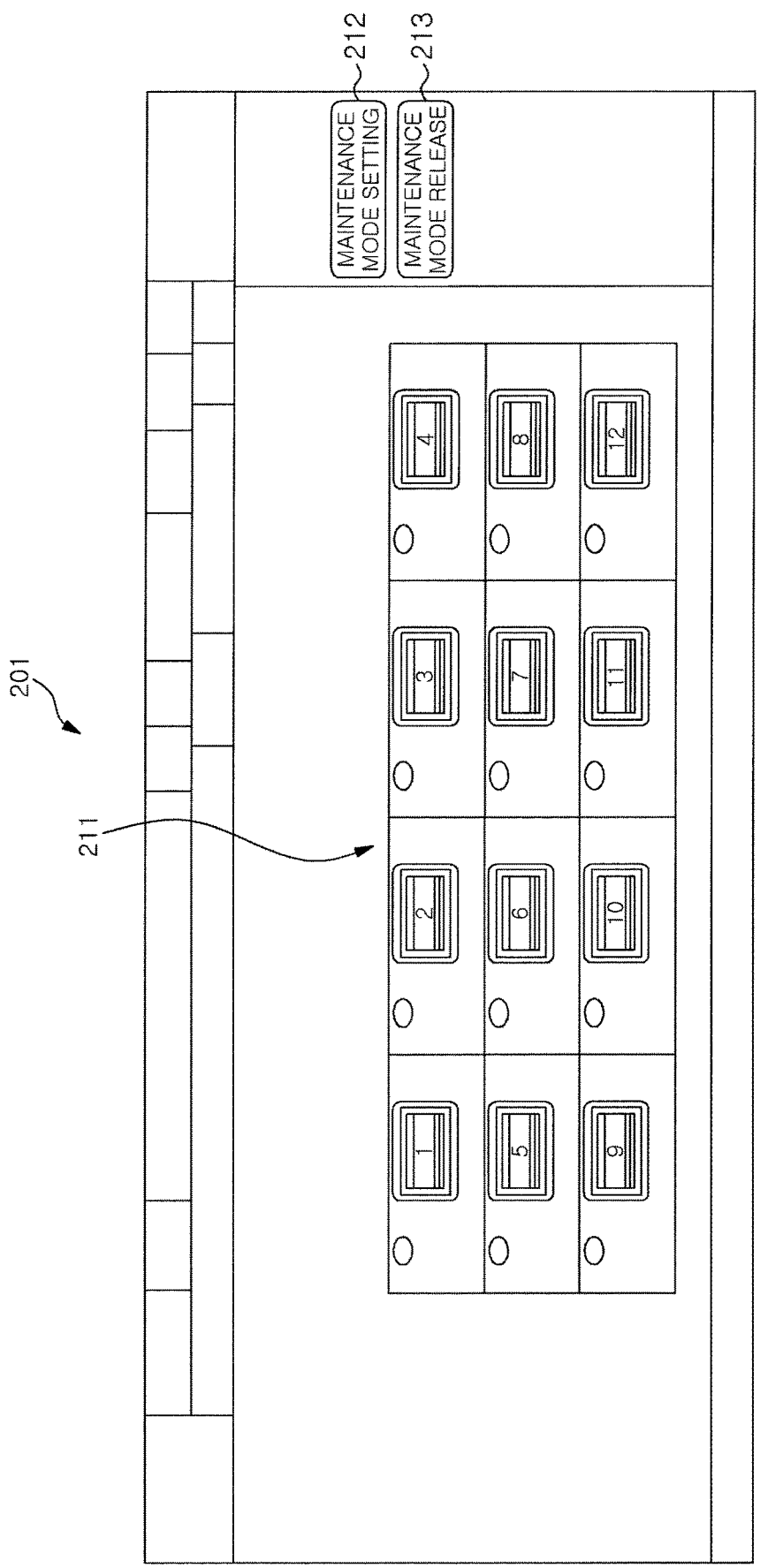
FIG. 8 shows an example of a local screen according to the embodiment.

FIG. 8 shows an example of the local screen 201 according to the embodiment. The local screen 201 show in FIG. 8 corresponds to the inspection device 1 having 12 inspection chambers 11 (cells 1 to 12) shown in FIG. 1. The local screen 201 in this example includes a cell state display unit 211, a maintenance mode setting button 212, and a maintenance mode release button 213. The cell state display unit 211 displays a state of each cell. The maintenance mode setting button 212 is an operation unit for setting a certain cell to a maintenance mode (shifting from the inspection mode to the maintenance mode). The maintenance mode release button 213 is an operation unit for releasing a cell set to the maintenance mode (returning from the maintenance mode to the inspection mode).

Referring back to FIG. 7, the flowchart will be described more. For example, the user starts an inspection process for all the inspection chambers 11 through the local screen 201 (step S102). In other words, all the cells 1 to 12 are set to the inspection mode.

Then, when the detection unit 101 detects abnormality in, e.g., the cell 1 (step S103), the user selects whether or not to set the cell 1 to the maintenance mode through the local screen 201 (step S104). When the cell 1 is not set to the maintenance mode (NO in step S104), the user separates the cell 1 from the inspection target through the local screen 201 and performs the inspection process of the other cells 2 to 12 (step S105).

On the other hand, when the cell 1 is set to the maintenance mode (YES in S104), the user shifts the cell 1 to the maintenance mode through the local screen 201 (step S106). Accordingly, the cell 1 is separated from the inspection target and becomes the maintenance target.

Figure 9:
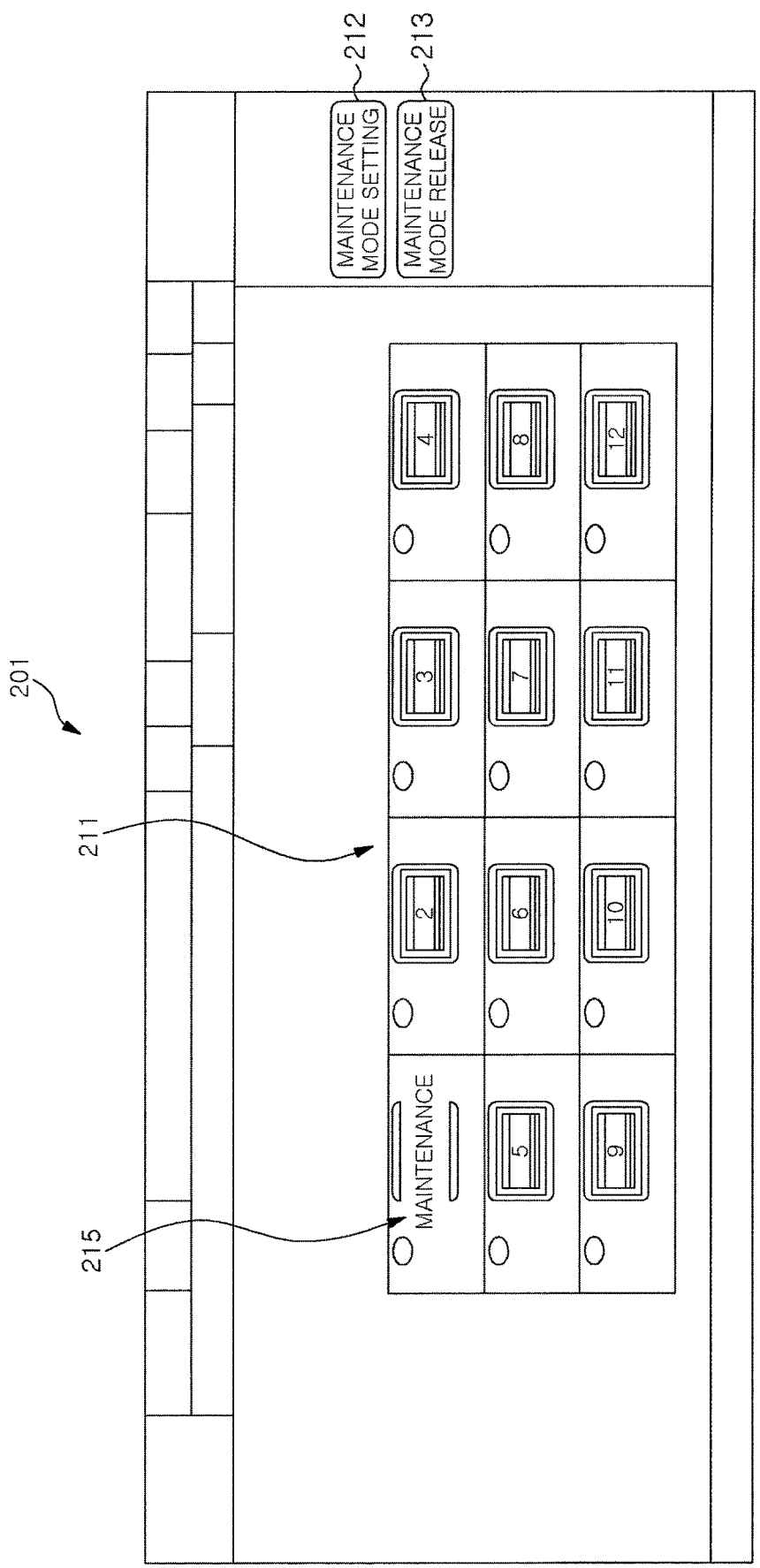
FIG. 9 shows an example of a state in the case of setting a maintenance mode on the local screen according to the embodiment.

FIG. 9 shows an example of a state in the case of setting the maintenance mode on the local screen 201 according to the embodiment. Here, a maintenance mode display 215 indicating that the maintenance mode has been set is displayed at a portion showing the state of the cell 1.

Referring back to FIG. 7, the flowchart will be described more. After the cell 1 having detected abnormality is set to the maintenance mode, the external device 17 is connected to the connection unit 105 (the connector 15) of the inspection device 1 (step S107). Then, the local screen display unit 121 displays an external device recognition screen showing the external device 17 of which connection to the connector 15 is recognized on the main monitor 14 (step S108). Thereafter, the user who manipulates the external device 17 manipulates the connection request screen displayed on the display of the external device 17 to obtain connection to the inspection device 1 (step S109). Next, the maintenance screen 202 is displayed on the display of the external device 17 (step S110). Then, the user performs the maintenance process through the maintenance screen 202 displayed on the display of the external device 17 (step S111).

Figure 10:
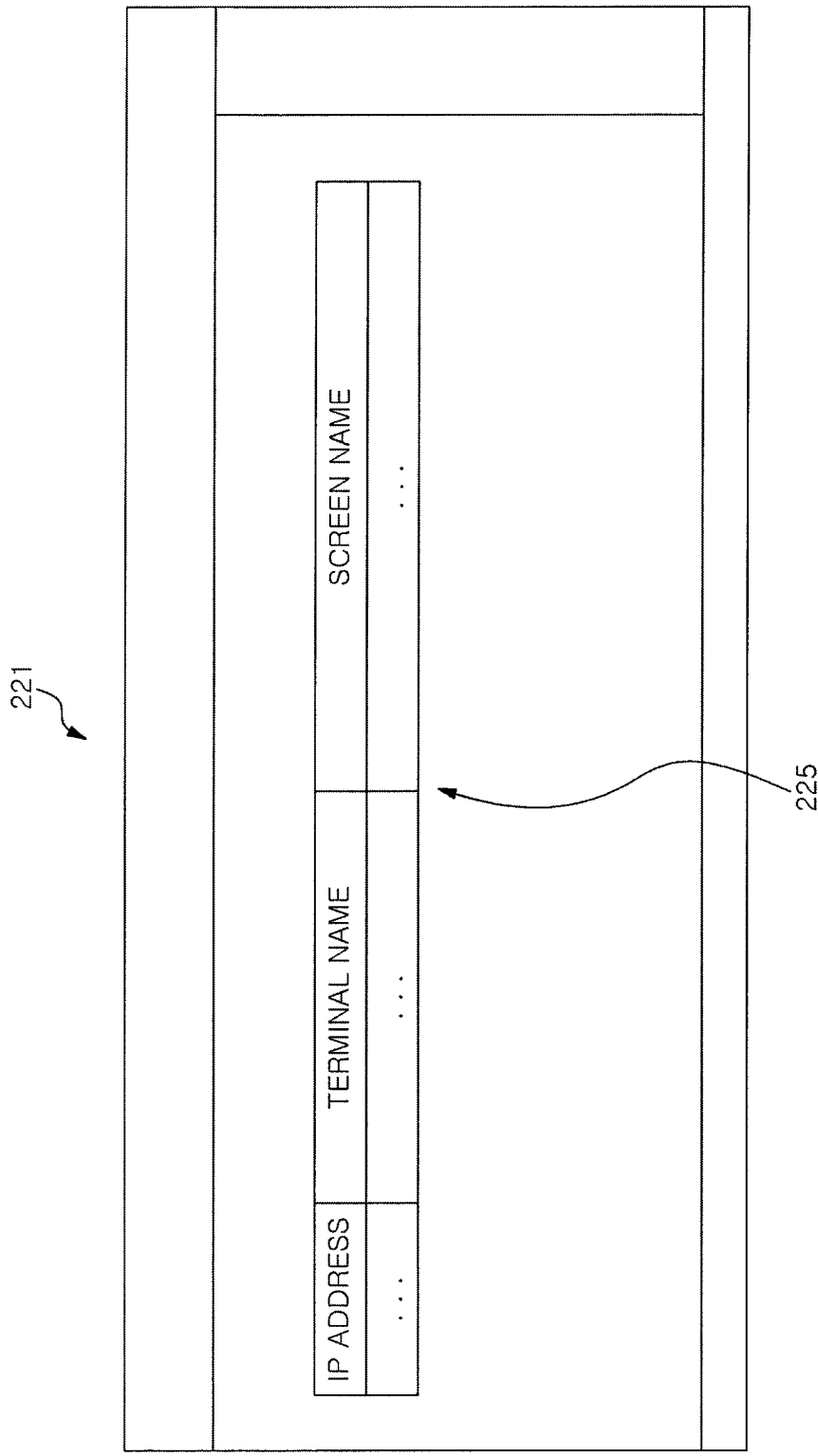
FIG. 10 shows an example of an external device recognition screen according to the embodiment.

FIG. 10 shows an example of an external device recognition screen 221 according to the embodiment. The external device recognition screen 221 in this example includes specification information 225 for specifying the external device 17 recognized by the inspection device 1. Here, an IP address, a terminal name, and a screen name are displayed as the specific information 225. However, the specific information is not limited thereto.

Figure 11:
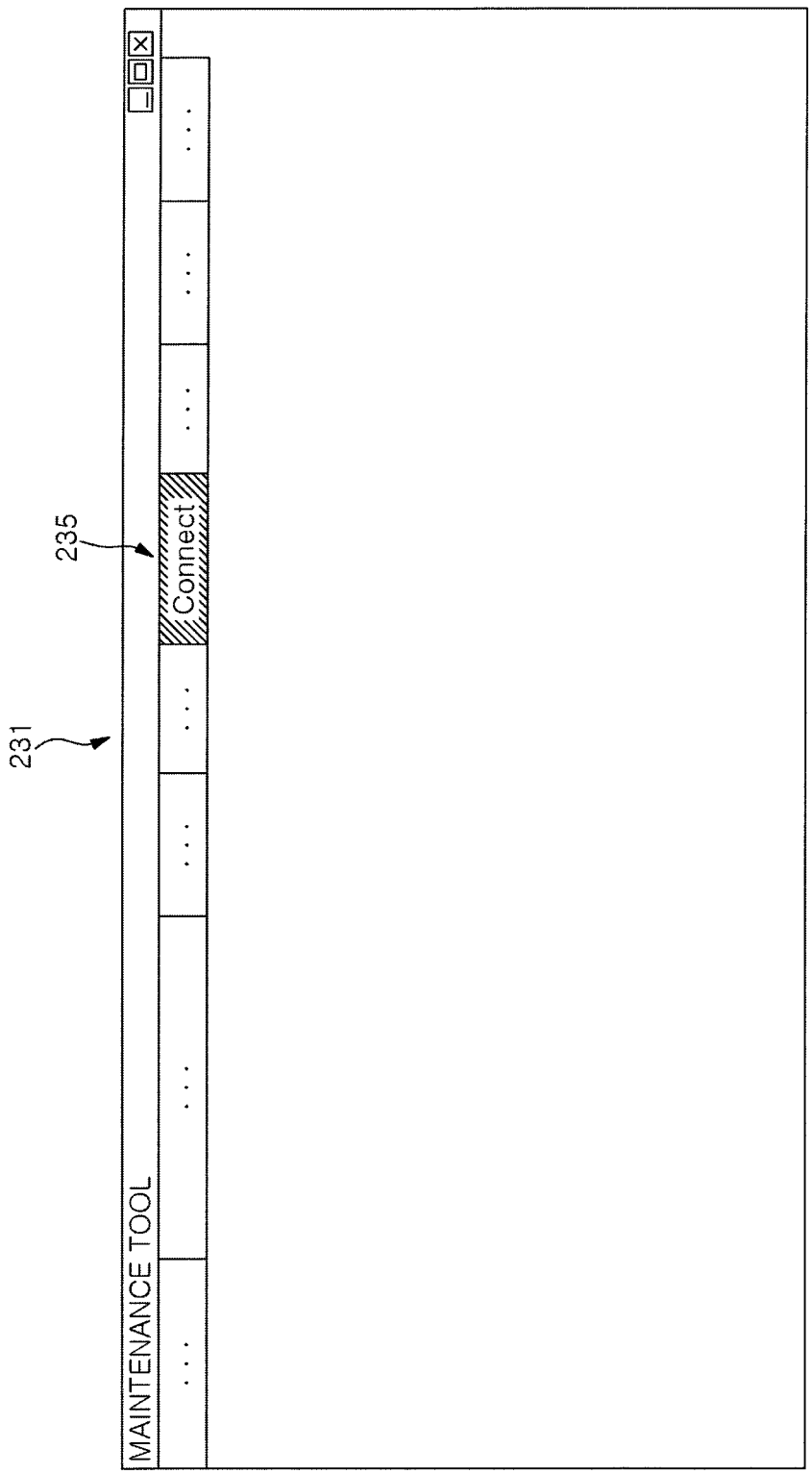
FIG. 11 shows an example of a connection request screen according to the embodiment.

FIG. 11 shows an example of a connection request screen 231 according to the embodiment. The connection request screen 231 in this example, which is used for starting the maintenance tool installed in the external device 17, includes a connection request button 235 for requesting connection with the inspection device 1. When the user presses the connection request button 235, the communication between the inspection device 1 and the external apparatus 17 is established. An authentication process for establishing communication may be performed.

Figure 12:
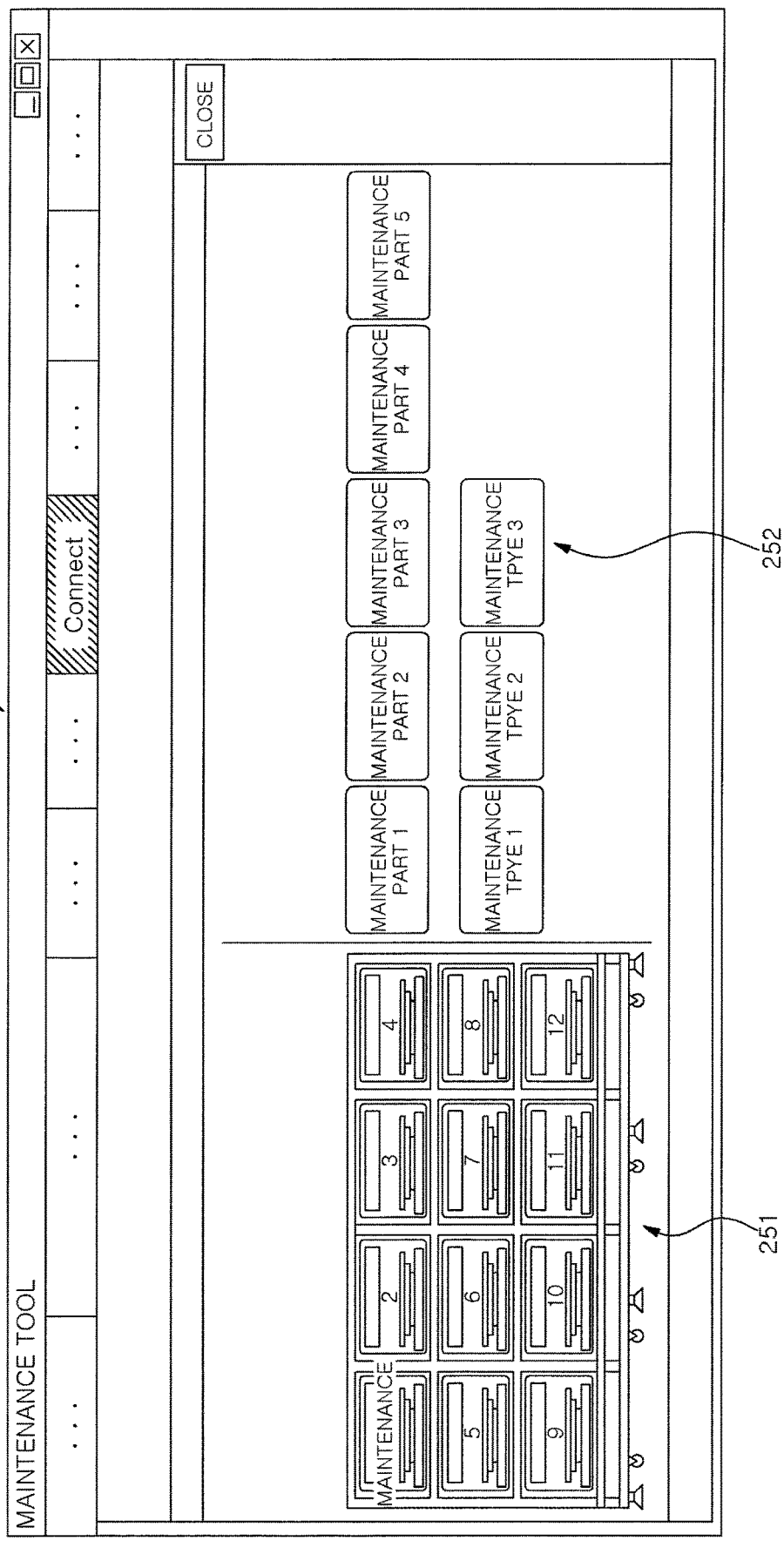
FIG. 12 shows an example of a maintenance screen displayed on an external device according to the embodiment.

FIG. 12 shows an example of the maintenance screen 202 displayed on the external device 17 according to the embodiment. The maintenance screen 202 in this example includes a cell state display unit 251 and a maintenance content setting unit 252. The cell state display unit 251 displays a cell set to the maintenance mode among a plurality of cells. In this example, the cell state display unit 251 displays that the cell 1 is set to the maintenance mode. The maintenance content setting unit 252 is used for selecting a type of the maintenance process to be performed on a cell set to the maintenance mode, or the like.

Referring back to FIG. 7, the flowchart will be described more. When the normal operation of the cell 1 is checked after the completion of the maintenance process performed through the maintenance screen 202 displayed on the external device 17 (step S112), the user releases the maintenance mode of the cell 1 through the maintenance screen 202 displayed on the external device 17 (step S113). Then, the user restores the cell 1 to the inspection target through the local screen 201 displayed on the main monitor 14 (step S114).

During the execution of steps S106 to S114, the first exclusive control and the second exclusive control are performed. The first exclusive control prevents the inspection process and the maintenance process from being simultaneously performed on one mechanism (cell 1 in this example). The second exclusive control enables only one operation between the operation on the maintenance screen 202 displayed on the external device 17 and the operation on the operation screen (the maintenance screen 202 or the local screen 201) displayed on the main monitor 14 in the case of performing the maintenance process on one mechanism.

Figure 13:
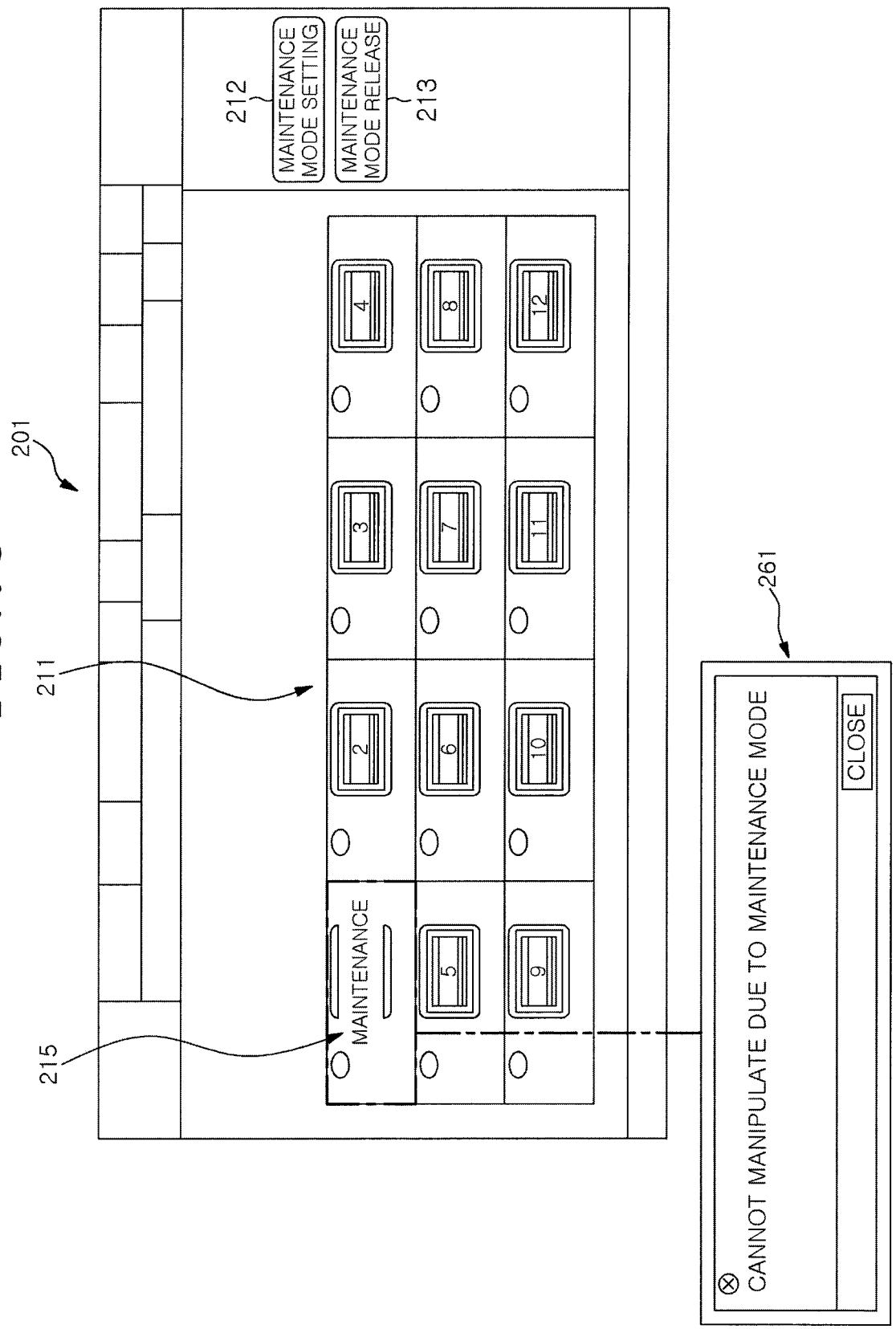
FIG. 13 illustrates a first example showing a state in which exclusive control is functioning on the local screen according to the embodiment.

FIG. 13 illustrates a first example showing a state in which exclusive control is functioning on the local screen 201 according to the embodiment. Here, a case where an inspection process is performed on the cell 1 set to the maintenance mode is illustrated. In this case, since the specified cell is set to the maintenance mode, a prohibition message 261 indicating that the inspection process cannot be performed is displayed. This process is an example of the first exclusive control.

Figure 14:
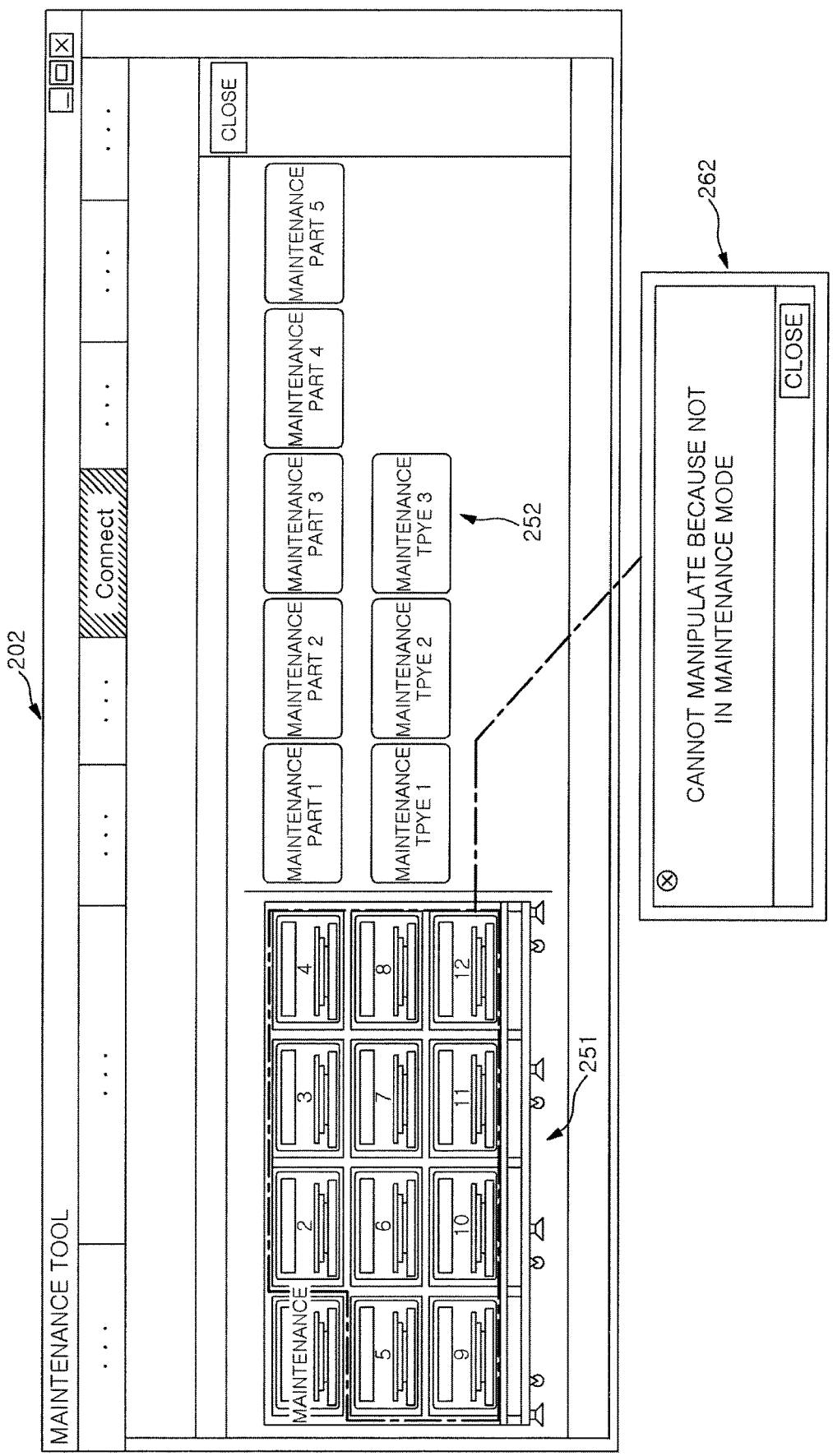
FIG. 14 illustrates a second example showing a state in which exclusive control is functioning on the maintenance screen of the external device according to the embodiment.

FIG. 14 illustrates a second example showing a state in which the exclusive control is functioning on the maintenance screen 202 of the external device 17 according to the embodiment. Here, a case where the maintenance process is performed on any one of the cells 2 to 12 set to the inspection mode is illustrated. In this case, the specified cell is set to the inspection mode, a prohibition message 262 indicating that the maintenance process cannot be performed is displayed. This process is an example of the first exclusive control.

Figure 15:
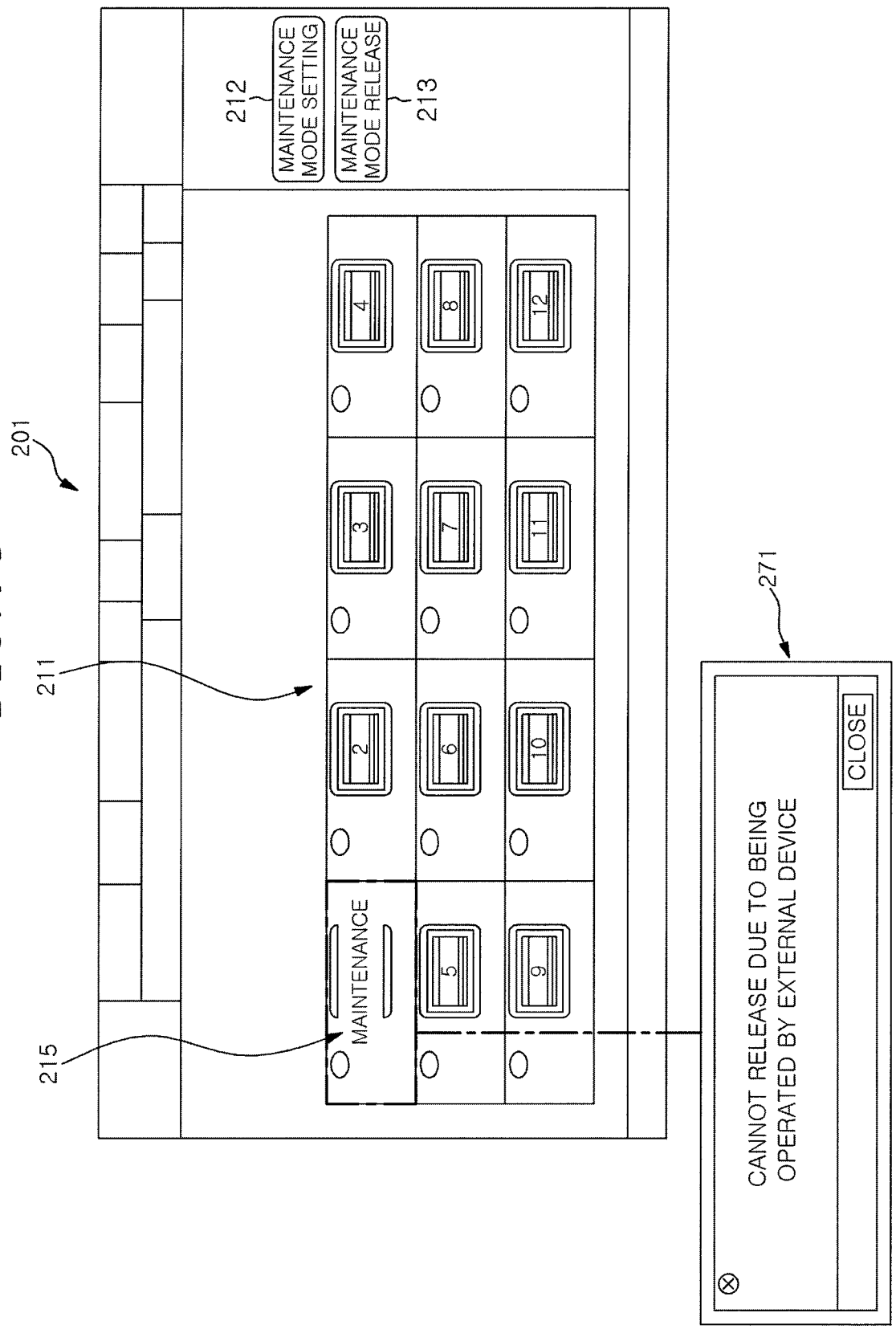
FIG. 15 illustrates a third example showing a state in which exclusive control is functioning on the local screen according to the embodiment.

FIG. 15 illustrates a third example showing a state in which exclusive control is functioning on the local screen 201 according to the embodiment. Here, a case where the maintenance mode of the cell 1 subjected to the maintenance process through the maintenance screen 202 displayed on the external device 17 is released through the local screen 201 displayed on the main monitor 14 is illustrated. In this case, since the specified cell is being operated by the external device 17, a prohibition message 271 indicating that the maintenance process cannot be released is displayed. This process is an example of the second exclusive control.

A program for realizing the function of the inspection device 1 may be recorded, as a file in an installable or executable format, in a computer-readable storage medium such as a CD-ROM, a flexible disk (FD), a CD-R, a DVD (Digital Versatile Disk), or the like. Further, the program may be stored in another computer connected to a network such as Internet or the like, and downloaded via the network. In addition, the program may be provided or distributed via the network.

As described above, in accordance with the present embodiment, it is possible to provide a technique capable of improving the maintenance performance of the inspection device having a plurality of inspection chambers.

The embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. An inspection device having a plurality of inspection chambers and configured to inspect target objects in the plurality of the inspection chambers, the inspection device comprising:
   a processor;
   a display; and
   a memory storing instructions thereon, the instructions when executed by the processor cause the processor to:
      display a screen for operating the inspection device on the display;
      perform an inspection process on the plurality of inspection chambers;
      perform a maintenance process on a mechanism related to the plurality of the inspection chambers;
      display a maintenance screen for receiving an operation for performing the maintenance process on the display;
      connect the inspection device and an external device;
      display a recognition screen on the display that the external device is recognized by the inspection device;
      perform exclusive control for preventing the inspection process and the maintenance process from simultaneously performing on the mechanism;
      display the maintenance screen on the external device;
      perform the maintenance process in response to an operation on the maintenance screen displayed on the external device and enable only one operation between the operation on the maintenance screen displayed on the external device or the operation on the screen displayed on the display when performing the maintenance process on the mechanism,
   wherein the instructions when executed by the processor further cause the processor to:
      transmit screen configuration data of the maintenance screen generated in the inspection device to the external device, and
      display the maintenance screen on the external device based on the received screen configuration data and perform the maintenance process of the inspection device through the external device when the external device does not have a function of performing the maintenance process.

2. The inspection device of claim 1, wherein the external device transmits operation information on the operation on the maintenance screen displayed on the external device to the inspection device, and the instructions when executed by the processor further cause the processor to control the maintenance process based on the operation information received from the external device.

3. The inspection device of claim 1, wherein the instructions when executed by the processor further cause the processor to:
   detect abnormality of the mechanism related to the inspection chambers, and
   perform the maintenance process on the mechanism related to the inspection chambers which has detected abnormality.

4. The inspection device of claim 2, wherein the instructions when executed by the processor further cause the processor to:
   detect abnormality of the mechanism related to the inspection chambers, and
   perform the maintenance process on the mechanism related to the inspection chambers which has detected abnormality.

5. A maintenance method for an inspection device including a plurality of inspection chambers and a display unit and configured to inspect target objects in the plurality of the inspection chambers, the maintenance method comprising:
   displaying a screen for operating the inspection device on the display unit;
   performing an inspection process on the plurality of inspection chambers;
   performing a maintenance process on a mechanism related to the plurality of the inspection chambers;
   displaying a maintenance screen for receiving an operation for performing the maintenance process on the display unit;
   connecting the inspection device and an external device;
   displaying a recognition screen on the display unit that the external device is recognized by the inspection device;
   performing exclusive control for preventing the inspection process and the maintenance process from simultaneously performing on the mechanism;
   displaying the maintenance screen on the external device;
   performing the maintenance process in response to an operation on the maintenance screen displayed on the external device; and
   enabling only one operation between the operation on the maintenance screen displayed on the external device or the operation on the screen displayed on the display unit when performing the maintenance process on the mechanism, and
   wherein the maintenance method further comprises:
      transmitting screen configuration data of the maintenance screen generated in the inspection device to the external device, and
      displaying the maintenance screen on the external device based on the received screen configuration data and performing the maintenance process of the inspection device through the external device when the external device does not have a function of performing the maintenance process.

6. A program stored on a non-transitory computer-readable storage medium, when executed by a processor in a computer for controlling an inspection device including a plurality of inspection chambers and a display unit and configured to inspect target objects in the plurality of the inspection chambers, causes the processor to perform processes including:
   displaying a screen for operating the inspection device on the display unit;

perform an inspection process on the plurality of inspection chambers;
performing a maintenance process on a mechanism related to the plurality of the inspection chambers;
displaying a maintenance screen for receiving an operation for performing the maintenance process on the display unit;
connecting the inspection device and an external device;
displaying a recognition screen on the display unit that the external device is recognized by the inspection device;
performing exclusive control for preventing the inspection process and the maintenance process from simultaneously performing on the mechanism;
displaying the maintenance screen on the external device;
performing the maintenance process in response to an operation on the maintenance screen displayed on the external device; and
enabling only one operation between the operation on the maintenance screen displayed on the external device or the operation on the screen displayed on the display unit in the case of performing the maintenance process on the mechanism,
wherein the program when executed by the processor further causes the processor to:
transmit screen configuration data of the maintenance screen generated in the inspection device to the external device, and
display the maintenance screen on the external device based on the received screen configuration data and performing the maintenance process of the inspection device through the external device when the external device does not have a function of performing the maintenance process.

* * * * *